United States Patent
Tsui et al.

[11] Patent Number: 5,959,309
[45] Date of Patent: Sep. 28, 1999

[54] SENSOR TO MONITOR PLASMA INDUCED CHARGING DAMAGE

[75] Inventors: Bing-Yue Tsui; Tzung-Zu Yang, both of Hsinchu, Taiwan

[73] Assignee: Industrial Technology Research Institute, Hsin-Chu, Taiwan

[21] Appl. No.: 08/826,718

[22] Filed: Apr. 7, 1997

[51] Int. Cl.$^6$ .................................................. H01L 23/58
[52] U.S. Cl. ............................... 257/48; 216/61; 438/18; 257/428; 324/769
[58] Field of Search ........................ 257/48, 428; 216/61; 438/18; 324/769

[56] References Cited

U.S. PATENT DOCUMENTS

| | | | |
|---|---|---|---|
| 5,434,108 | 7/1995 | Ko et al. | 437/228 |
| 5,514,623 | 5/1996 | Ko et al. | 437/189 |
| 5,598,009 | 1/1997 | Bui | 257/48 |

OTHER PUBLICATIONS

JP McVittie, "International Symposium on Plasma Process–Induced Damage" Proceeding of the 1966, p. 7–10, Pubin American Vacuum Society.

Ma&McVittie, "International Symposium on Plasma Process–Induced Damage" Proceedings of the 1966, p. 20–23, Pubin American Vacuum Society.

W. Lukaszek et al. International Symposium on Plasma Process–Induced Damage, Proceeding of the 1966, p. 30–33, Pubin American Vacuum Society.

*Primary Examiner*—John Guay
*Attorney, Agent, or Firm*—George O. Saile; Stephen B. Ackerman

[57] ABSTRACT

A monitor has been developed for measuring charging currents and voltages in a plasma environment. An antenna in the form of a small aluminum pad is connected to ground through a blocking diode, a blocking transistor, and a storage capacitor. The blocking transistor controls the flow of charge to the capacitor, its control gate being activated by a string of photodiodes that are exposed to the plasma. In a second embodiment, the photodiodes are omitted and the gate is connected directly to the antenna. This ensures that the capacitor charges only while the plasma is on. Once the plasma process has been completed, the monitor may be interrogated at leisure by reading the voltage stored on the capacitor. A resistor, connected in parallel with the capacitor, allows current, as well as voltage, measurements to be made. By using either n-channel or p-channel MOSFETs, electron charging or ion charging respectively may be measured. A plurality of such monitors are implemented on a single chip, each monitor using a resistor of a different value. This allows the I-V characteristics of the plasma to be determined.

23 Claims, 6 Drawing Sheets

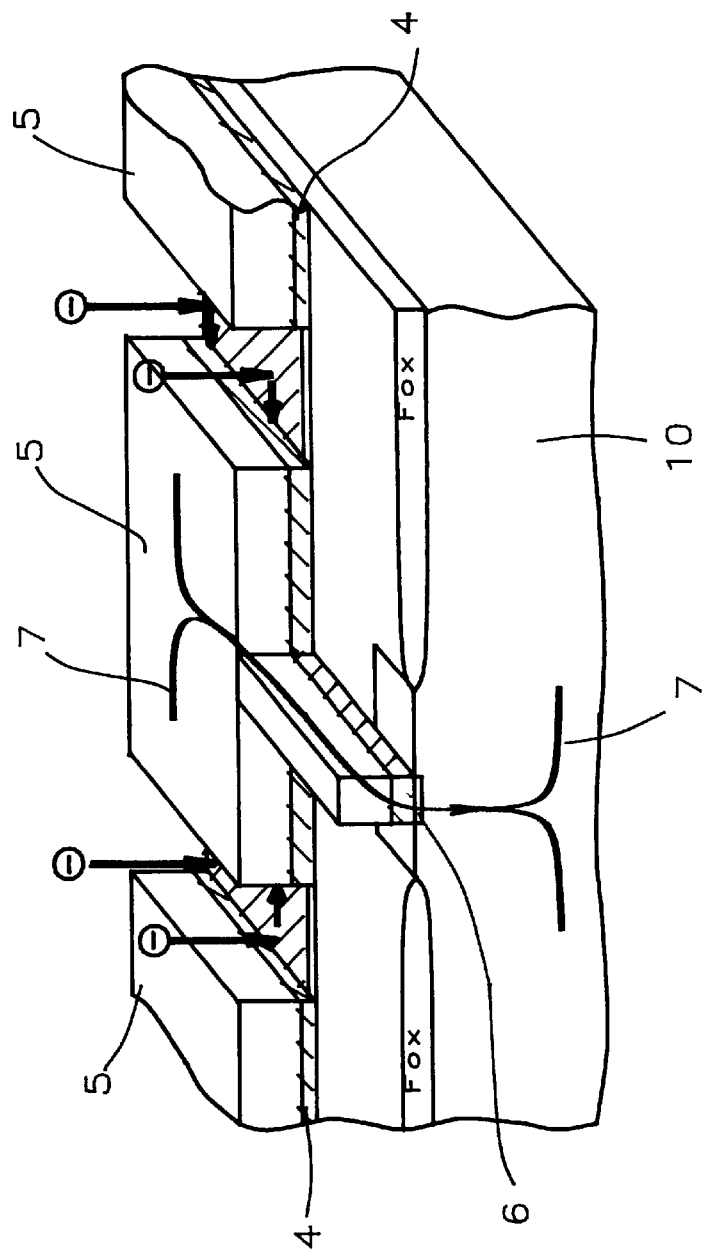
FIG. 1 – Prior Art

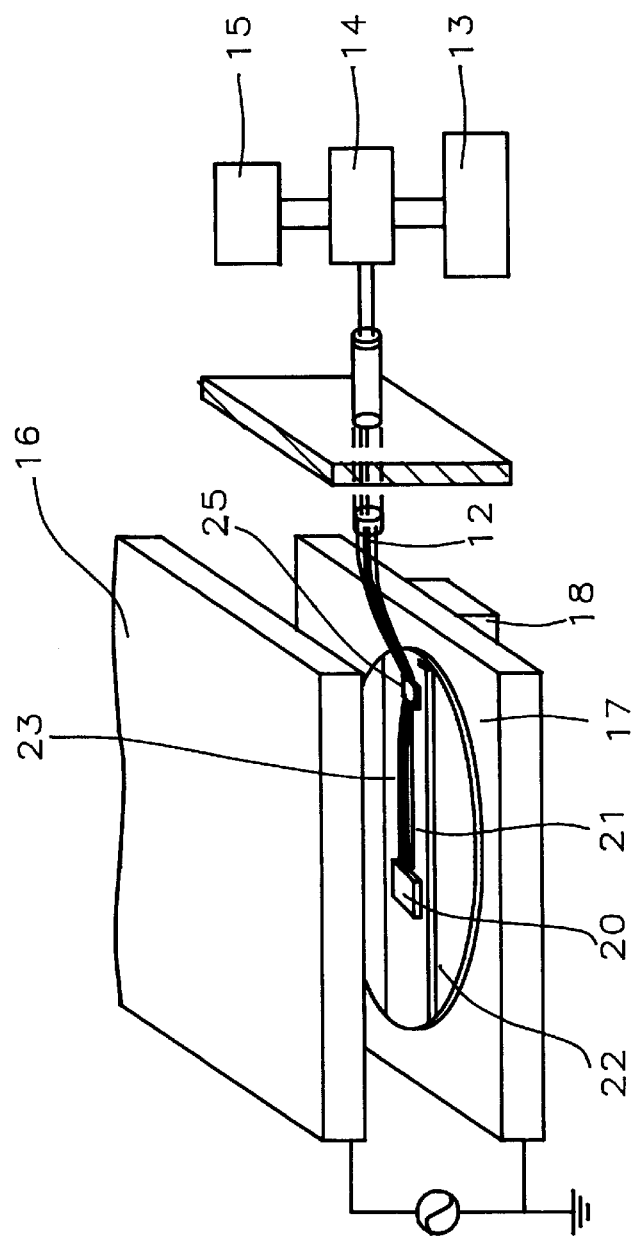
FIG. 2 – Prior Art

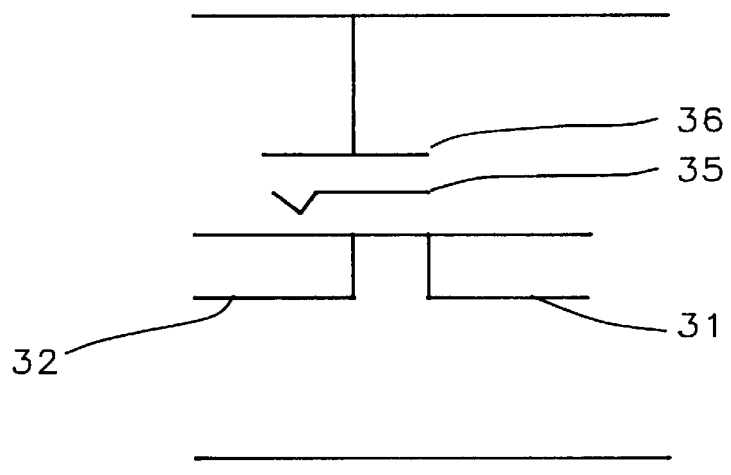
FIG. 3a – Prior Art
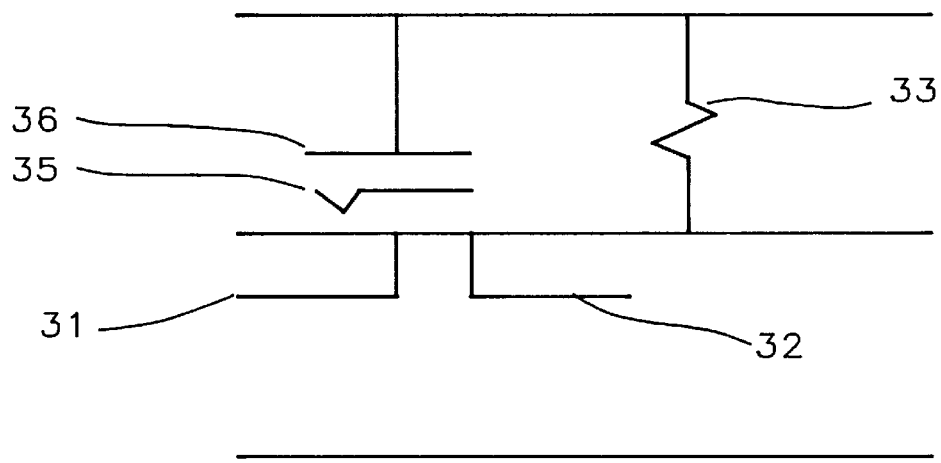
FIG. 3b – Prior Art

SENSOR TO MONITOR PLASMA INDUCED CHARGING DAMAGE

BACKGROUND OF THE INVENTION (1) Field of the Invention

The invention relates to the general field of plasma etching, more particularly to the antenna effect.

(2) Description of the Prior Art

Dry etching, wherein the etchant is an electrically excited gas, is widely used in the integrated circuit art. In general, the surface to be etched is coated with a patterned layer of photoresist and then exposed to a gaseous plasma of a corrosive gas. In certain situations dry etching in a gaseous plasma offers several advantages over wet etching but plasma etching is also subject to a problem known as the antenna effect. Since the plasma comprises a mix of charged particles there is sometimes a tendency for some of said particles to accumulate on certain surfaces. This, in turn, can lead to damage of certain gates in MOS devices.

How such damage can occur is illustrated in FIG. 1. This shows an isometric cross-section of an FET gate and attached electrode in the process of being formed by etching in a plasma. Polysilicon layer 4 had previously been deposited over the layer of field oxide (FOX) that overlies silicon substrate 1 and is in the process of being shaped to form a gate electrode. This is being effected using plasma etching. Photoresist mask 5 defines the shape that is desired. Because of non-uniformities in the plasma a preponderance of electrons accumulate on the exposed surfaces of layer 4 raising it to a negative potential. This, in turn, leads to a potential difference appearing across gate oxide layer 6. Said potential difference can then lead to damage, either because of dielectric breakdown in 6 or simply as result of tunneling currents through it. Note that, as illustrated by bifurcated arrow 7, for this type of geometry oxide layer 6 acts as a bottleneck for current drawn from a large source and going into a large sink, so that the current density through it can be quite high. An overview of the process can be found in the article by J. P. McVittie in the proceedings of the 1966 "International Symposium on Plasma Process-Induced Damage" pp. 7–10 published by the American Vacuum Society.

Several methods have been reported for monitoring the antenna effect. In particular, these methods provide ways to measure plasma current and voltage. The Stanford Plasma On-wafer Real Time (SPORT) probe has been described in an article by Ma and McVittie in the proceedings of the 1966 "International Symposium on Plasma Process-Induced Damage" pp. 20–23 published by the American Vacuum Society. The intent of SPORT is to minimize perturbation of the plasma while directly measuring charging voltages and currents. FIG. 2 shows a schematic view of a single pad SPORT. Aluminum pad 20 sits on oxide layer 21 which has been formed over part of silicon wafer 22. Polysilicon lead 23 connects to contact pad 24 while pad 25 is connected to silicon wafer 22. Twin lead 12 is connected to 24 and 25 and serves to carry current to the outside of the plasma to oscilloscope (or voltmeter) 13 and bias unit 15 after first passing through low pass filter 14 to remove any RF component. The plasma itself is initiated and sustained between electrodes 16 and 17. A bar magnet 18 may be placed underneath 17 in order to distort the plasma, thereby enhancing the antenna effect.

The SPORT probe is suited for use in a mass-production environment. However, it is an invasive method requiring the running of wires into the plasma chamber.

The CHARge Monitor (CHARM) wafer is a passive monitor based on an Electrically Erasable Programmable Read Only Memory (EEPROM) device. FIG. 3a is a schematic cross-section of CHARM that shows its principal parts. Source/drain 31/32 are controlled from floating gate 35 which receives its charge from charging electrode 36. Due to an asymmetry in the physical shapes of the two surfaces of 35 and 36 that face each other, electrons will flow into 35 from 36 much more easily than in the reverse direction. Thus, the threshold voltage for current flow between 31 and 32 will be a measure of the voltage level to which 35 floated during its exposure to the plasma. By adding current sensing resistor 33 between the substrate and the charging gate (FIG. 3b) current density in the plasma may be determined from the known value of 33 and the voltage that was across it when it was exposed to the plasma (as derived from the EEPROM measurements after removal from the plasma).

The CHARM wafer also has some drawbacks. First, the minimum detectable voltage is about 2.3 volts. Second, the charge stored in the EEPROM decays with time so measurements must be made very soon after exposure to the plasma. Third, fabrication of EEPROMs requires special technology not generally available in most IC fabrication facilities. CHARM has been described in an article by W. Lukaszek et al. in the proceedings of the 1966 "International Symposium on Plasma Process-Induced Damage" pp. 30–33 published by the American Vacuum Society.

SUMMARY OF THE INVENTION

It has been an object of the present invention to provide a monitor for measuring charging voltages and currents in a plasma environment.

Another object of the present invention has been to provide a method for using said monitor.

A further object of the present invention has been that said monitor be minimally invasive in its use.

A still further object has been that the monitor be able to retain information concerning the plasma for several hours after its removal from the plasma.

Yet another object has been that the monitor be capable of measuring charging voltages in a range of from about 0.1 volts to more than 20 volts.

These objects have been achieved by providing an antenna in the form of a small aluminum pad which is connected to ground through a blocking diode, a blocking transistor, and a storage capacitor. The blocking transistor controls the flow of charge to the capacitor, its control gate being activated either by a string of photodiodes that are exposed to the plasma or by connecting it directly to the antenna. This ensures that the capacitor charges only while the plasma is on. Once the plasma process has been completed, the monitor may be interrogated at leisure by reading the voltage stored on the capacitor. A resistor, connected in parallel with the capacitor, allows current, as well as voltage, measurements to be made. A plurality of such monitors are implemented on a single chip, each monitor using a resistor of a different value. This allows the I-V characteristics of the plasma to be determined.

BRIEF DESCRIPTION OF THE DRAWINGS

FIG. 1 illustrates the antenna effect, showing how damage to a gate oxide can occur during plasma processing.

FIG. 2 illustrates the SPORT probe which directly measures charging voltages and currents in the plasma environment.

FIGS. 3a and 3b illustrate the CHARM device which uses EEPROM technology to store charging voltage and current information for later interrogation.

FIG. 5 is a simplified plan view of the hardware implementation of the circuit shown in FIG. 4a.

FIGS. 6a and 6b are cross-sectional views of different parts of the hardware implementation of the circuit shown in FIG. 4a.

DESCRIPTION OF THE PREFERRED EMBODIMENTS

Figure 4A:
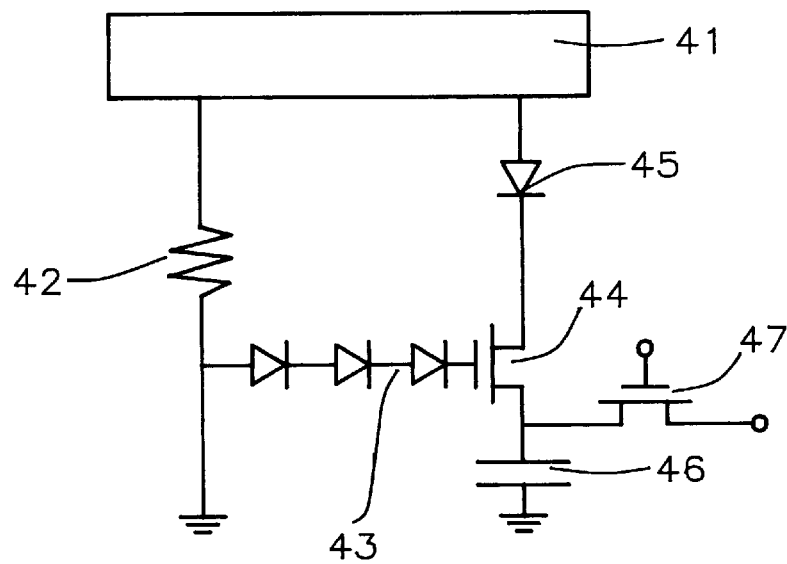
FIG. 4a is a circuit schematic of the monitoring device that constitutes the present invention.

FIG. 4a is a schematic representation of the circuit that is used to implement the present invention. Antenna 41 is connected to ground through resistor 42. One end of a string of photodiodes 43 is connected to 42 and to ground. The other end of 43 is connected to the gate of blocking transistor 44. Blocking diode 45 is connected between antenna 41 and the source/drain of the blocking transistor while storage capacitor 46 is connected between the drain/source of the blocking transistor and ground.

Pass transistor 47 is connected between the non-ground side of 46 and an external voltmeter (not shown). The gate of 47 is attached to an independently controlled voltage source so that the voltage to which 46 has been charged may be read at any time.

To operate the monitor shown in FIG. 4a, antenna 41 is placed inside, and exposed to, the plasma. At the same time, light from the plasma (generally in a wavelength range between about 1,000 and 10,000 Angstroms) interacts with the photodiodes so that each of them now generates its characteristic voltage (about 0.4 volts). Thus, voltage is applied to the gate of blocking transistor 44 as soon as the plasma is initiated. This voltage will be the sum of all the invidual photovoltages of the separate photodiodes—typically between about 10 and 20 volts for between 25 and 50 photodiodes in the string.

Thus, blocking transistor 44 passes current only as long as the plasma is on. This current charges capacitor 46 until it reaches a potential equal to that of antenna 41. Because the current of a plasma system is limited, the potential of antenna 41 will be equal to the voltage drop, due to the plasma current. So, for 42 very high (effectively infinite) the potential on 46 will be the highest antenna potential (typically between about 1 and 20 volts) while it will be less for lower values of 42. Once the potential on 46 (i.e. the potential on 41), as well as the value of 42, are known, the plasma current may be computed.

Because the gate of blocking transistor 44 is controlled by the photovoltage of the photodiode string, storage capacitor 46 can only be charged to the potential of said photovoltage, less the threshold voltage of blocking transistor 44 (typically between about 0.5 and 1 volt).

Figure 4B:
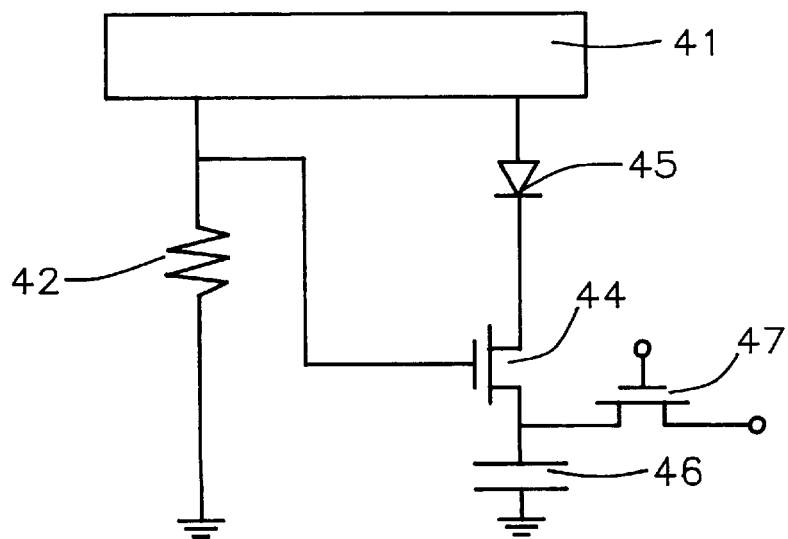
FIG. 4b is a circuit schematic of a second embodiment of the present invention.

In a second embodiment of the present invention, illustrated in FIG. 4b and costing less to implement than the embodiment illustrated in FIG. 4a, the photodiode string is eliminated and blocking transistor 44 is tied to the antenna potential itself. Since the antenna potential exceeds the threshold voltage of the blocking transistor, the latter will be caused to conduct. The voltage on storage capacitor 46 thereby becomes equal to the antenna potential. Once the plasma is turned off, the charge on the antenna leaks to ground through resistor 42 so blocking transistor 44 is also turned off. The value of the plasma current can then be derived from the antenna potential and the value of the parallel resistor.

Note that, except for the differences noted above, the theory and operation of the two types of sensor (FIGS. 4a and 4b) are the same. However, the embodiment of FIG. 4a is more expensive to implement while the embodiment of FIG. 4b is not as well protected against electrostatic discharges.

Blocking diode 45 is placed between antenna 41 and blocking transistor 44 to ensure that charge flows from 41 to 44 in one direction only. In the most commonly used configuration, the transistors are all n-channel MOSFETs (NPN devices) so that the monitor measures the positive potential of the antenna. However, it is also possible to use all p-channel MOSFETs (PNP devices), together with a reversal of all the diodes, in which case the monitor measures the negative potential of the antenna.

We note here that we have found that the voltage loss exhibited by the monitors described above is less than 0.1 volts 2.7 hours after exposure to the plasma. This is a better performance than a CHARM wafer for which the corresponding voltage loss would be about 1 volt. As already stated above, the number of photodiodes in the string is between about 25 and 50. This allows detection by the monitor of voltages up to about 20 volts.

A possible path for leakage of the charge stored on capacitor 46 is through the source/drain junction of blocking transistor 44. To minimize this the area of the source/drain junction should be as small as possible. A typical value would be about 4 microns$^2$ but any value between about 1 and 10 microns $^2$ would be acceptable. Such leakage as does occcur can be minimized by using a capacitor whose capacitance is not too low. We have found a value between about 0.1 and 10 nF to be acceptable. It is also important to make sure that the thickness of the dielectric used in 46 is not so low that Fowler-Nordheim tunneling can occur. With this in mind we have typically used a thickness between about 200 and 500 Angstroms.

To implement the monitors described above, standard integrated circuit technology is all that is needed. The antenna is formed from a layer of aluminum (or similar metal), between about 4,000 and 8,000 Angstroms thick, that lies on the top surface of the device. Typically (but not necessarily) it is a rectangle such as 51 in FIG. 5 measuring between about 700 and 1,000 microns by between about 700 and 1,000 microns and having an area between about 5×10$^5$ and 10$^6$ sq. microns. Resistor 42, diode 45, transistor 44 and capacitor 46 are all located underneath 51 to shield them from the plasma and its emitted radiation, while photodiode string 43 (embodiment of FIG. 4a) is located alongside 51 in an area shown as dotted rectangle 52 so as ensure exposure of the photo junctions to the plasma radiation as soon as it is initiated. Pass transistor 47 is located beneath 51. The voltmeter are located outside the plasma chamber.

Figure 6A:
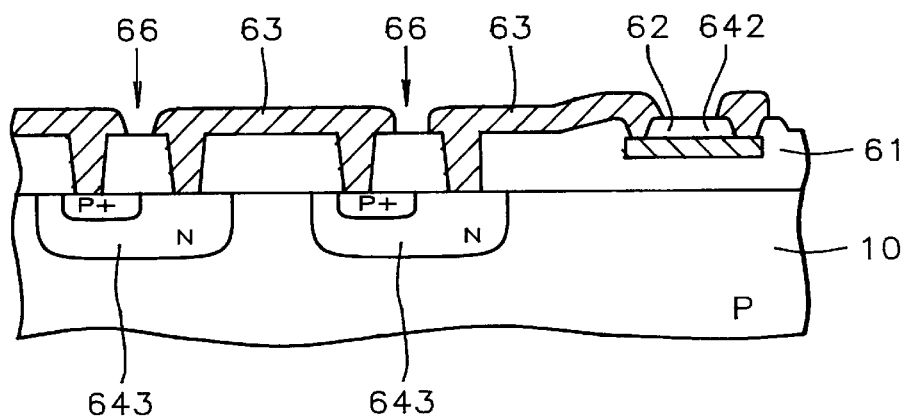
Figure 6B:
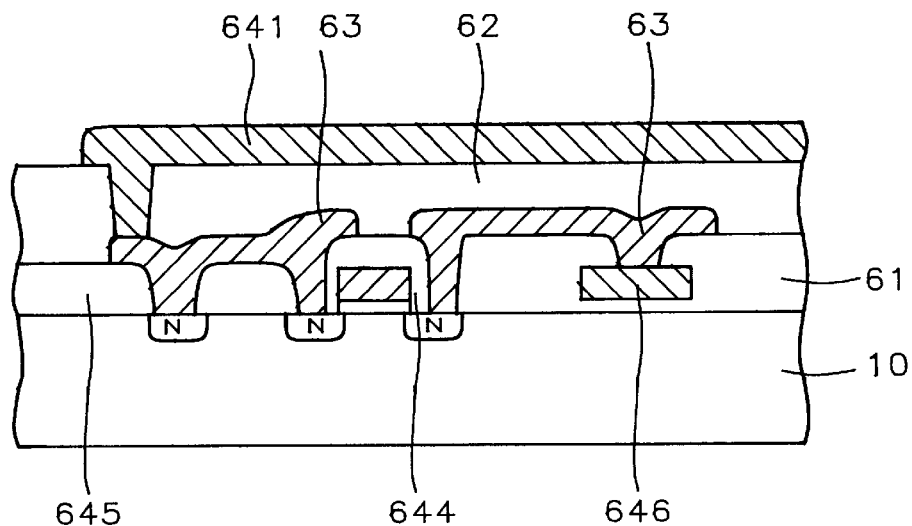

FIGS. 6a and 6b are cross-sectional views of the integrated circuit implementation of the circuit seen in FIG. 4a. P substrate 10 has been coated with insulating layer 61. In FIG. 6a polysilicon (or, alternately, diffused) resistor 642 (protected by passivating layer 62) is seen connected through metal layer 63 to one end of the photodiode string of which only two members 643 are shown. Note the presence of windows 66 through which light from the plasma can reach the photojunctions. FIG. 6b shows blocking diode 645 and blocking transistor 644 as well as capacitor 646. Finally, antenna 641 is shown located above the other devices separated from them by passivating layer 62.

Figure 5:
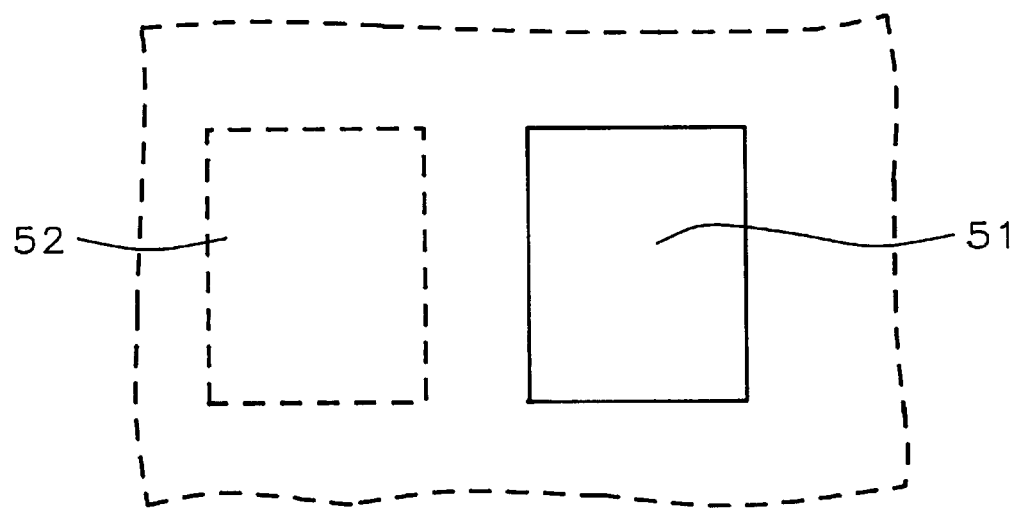

FIG. 5 is a simplified plan view of a single monitor as described in the circuit diagram of FIG. 4a. The area occupied by such a single monitor is between about $5\times10^5$ and $10^6$ sq. microns which is much less than can be accommodated on a full chip, even a small die measuring 10 by 10 mm. Accordingly, we have found it advantageous to implement more than one monitor on each chip. This introduces a safety factor in case a given monitor malfunctions. It also makes it possible to provide each of the monitors on a single chip (anywhere from 2 to about 100 monitors per chip) with a resistor that has a different value from all the others. In this way a series of different voltage readings is obtained from the different monitors, enabling the full I-V characteristics of the plasma to be plotted. We have found that resistors should have values in the range of from about 100 to $10^6$ ohms. Typical plasma currents are between about $10^{-6}$ and $10^{-2}$ amps/cm.$^2$.

While the invention has been particularly shown and described with reference to the preferred embodiments thereof, it will be understood by those skilled in the art that various changes in form and details may be made without departing from the spirit and scope of the invention.

What is claimed is:

1. A plasma induced charging monitor comprising:
   an antenna;
   a resistor, having first and second ends, said resistor first end being connected to the antenna;
   a photodiode string, having first and second ends and comprising a plurality of photodiodes connected in series, said first photodiode string end being connected to said resistor second end and also to ground;
   a blocking transistor, having a source, a drain and a gate, said gate being connected to said second photodiode string end;
   a blocking diode, having first and second ends, said first blocking diode end being connected to said blocking transistor source and said second blocking diode end being connected to the antenna;
   a storage capacitor, having first and second ends, said first capacitor end being connected to ground and said second capacitor end being connected to said blocking transistor drain; and
   a pass transistor, having a source, a drain, and a gate, said pass transistor source being connected to said second storage capacitor end and to said blocking transistor drain, said pass transistor drain being connected to a voltmeter, and said pass transistor gate being connected to an independently controlled voltage source.

2. The monitor described in claim 1 wherein the antenna, the resistor, the photodiode string, the blocking transistor, the blocking diode, the storage capacitor, and the pass transistor are located inside the plasma while the independently controlled voltage source, and the voltmeter are located outside the plasma.

3. The monitor described in claim 1 wherein the antenna, the resistor, the photodiode string, the blocking transistor, the blocking diode, the storage capacitor, and the pass transistor are on a single semiconductor chip, the string of photodiodes being located so that they are exposed to light emitted by the plasma, and the antenna being located so that it is in contact with the plasma.

4. The monitor described in claim 3 wherein the transistors are N channel MOSFETs.

5. The monitor described in claim 3 wherein the transistors are P channel MOSFETs.

6. A plasma monitoring chip comprising a plurality of between 2 and about 100 of the monitors described in claim 3.

7. The plasma monitoring chip of claim 6 wherein the resistor in each monitor has a value that is different from the values of the resistors in the other monitors.

8. The plasma monitoring chip of claim 6 wherein the resistors have values in the range between about $10^2$ and $10^6$ ohms.

9. The plasma induced charging monitor of claim 1 wherein the capacitor has a value in the range between about 0.1 and 10 nanofarads.

10. The plasma induced charging monitor of claim 1 wherein the number of photodiodes in said photodiode string is between about 25 and 50.

11. The plasma induced charging monitor of claim 1 wherein the antenna is a layer of aluminum between about 4,000 and 8,000 Angstroms thick having an area between about $5\times10^5$ and $10^6$ sq. microns.

12. The plasma induced charging monitor of claim 1 wherein the area of the blocking transistor source junction is between about 1 and 10 sq. microns.

13. A plasma induced charging monitor comprising:
   an antenna;
   a resistor, having first and second ends, said resistor first end being connected to the antenna and said resistor second end being connected to ground;
   a blocking transistor, having a source, a drain and a gate, said gate being connected to the antenna;
   a blocking diode, having first and second ends, said first blocking diode end being connected to said blocking transistor source and said second blocking diode end being connected to the antenna;
   a storage capacitor, having first and second ends, said first capacitor end being connected to ground and said second capacitor end being connected to said blocking transistor drain; and
   a pass transistor, having a source, a drain, and a gate, said pass transistor source being connected to said second storage capacitor end and to said blocking transistor drain, said pass transistor drain being connected to a voltmeter, and said pass transistor gate being connected to an independently controlled voltage source.

14. The monitor described in claim 13 wherein the antenna, the resistor, the blocking transistor, the blocking diode, the storage capacitor, and the pass transistor are located inside the plasma while the independently controlled voltage source, and the voltmeter are located outside the plasma.

15. The plasma induced charging monitor of claim 13 wherein the capacitor has a value in the range between about 0.1 and 10 nanofarads.

16. The plasma induced charging monitor of claim 13 wherein the antenna is a layer of aluminum between about 4,000 and 8,000 Angstroms thick having an area between about $5\times10^5$ and $10^6$ sq. microns.

17. The plasma induced charging monitor of claim 13 wherein the area of the blocking transistor source junction is between about 1 and 10 sq. microns.

18. A method for monitoring plasma induced charging, comprising:
   turning on said plasma, thereby causing it to emit light;
   providing a string of photodiodes, in series, that is exposed to said light thereby generating a photovoltage;

using said photovoltage to turn on a blocking transistor that is connected between an antenna and a storage capacitor, thereby causing the storage capacitor to be at the potential of the antenna less the threshold voltage of the blocking transistor and and the cut-in voltage of the diode;

providing a blocking diode between the antenna and said blocking transistor whereby only one type of charge can flow from the antenna to the storage capacitor;

turning off said plasma; and measuring the potential stored on the storage capacitor.

19. The method of claim 18 further comprising inserting an independently controlled pass transistor between the voltmeter and the storage capacitor whereby the voltmeter will not read the potential stored on the storage capacitor until said pass transistor is turned on.

20. The method of claim 18 further comprising:

connecting a resistor, having a resistance value, between the antenna and ground thereby causing the measured potential of the antenna to be reduced; and using said reduced measured potential and the value of the resistor to obtain a value for plasma current.

21. The method of claim 20 wherein multiple values for plasma current are obtained simultaneously by simultaneously using multiple resistors having different values one from another.

22. The method of claim 18 wherein the antenna potential is in the range of from about 1 to 20 volts.

23. The method of claim 20 wherein the plasma current is between about $10^{-6}$ and $10^{-2}$ amps/cm.$^2$.

* * * * *